(12) United States Patent
Shih

(10) Patent No.: US 9,761,540 B2
(45) Date of Patent: Sep. 12, 2017

(54) WAFER LEVEL PACKAGE AND FABRICATION METHOD THEREOF

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/927,491

(22) Filed: Oct. 30, 2015

(65) Prior Publication Data

US 2016/0379935 A1 Dec. 29, 2016

Related U.S. Application Data

(63) Continuation-in-part of application No. 14/749,619, filed on Jun. 24, 2015, now abandoned.

(51) Int. Cl.

| H01L 23/48 | (2006.01) |
|---|---|
| H01L 23/00 | (2006.01) |
| H01L 23/498 | (2006.01) |
| H01L 23/367 | (2006.01) |
| H01L 23/373 | (2006.01) |
| H01L 23/16 | (2006.01) |

(Continued)

(52) U.S. Cl.
CPC .......... *H01L 23/562* (2013.01); *H01L 21/561* (2013.01); *H01L 23/16* (2013.01); *H01L 23/3672* (2013.01); *H01L 23/3736* (2013.01); *H01L 23/49816* (2013.01); *H01L 23/49827* (2013.01); *H01L 23/49838* (2013.01); *H01L 23/3128* (2013.01); *H01L 2224/16* (2013.01); *H01L 2224/94* (2013.01)

(58) Field of Classification Search
CPC ..... H01L 23/00; H01L 23/373; H01L 23/367; H01L 23/498; H01L 23/31; H01L 23/562; H01L 23/49816; H01L 23/49838; H01L 23/3672; H01L 23/16; H01L 21/561; H01L 23/3736; H01L 2224/94; H01L 23/3218; H01L 2224/16
USPC ............ 257/738, 787–790, E21.02; 438/112, 438/114, 127
See application file for complete search history.

(56) References Cited

U.S. PATENT DOCUMENTS

| 8,580,683 B2 | 11/2013 | Wang |
| 8,884,419 B1 | 11/2014 | Liou |
| 8,952,526 B2 | 2/2015 | Lin |

(Continued)

FOREIGN PATENT DOCUMENTS

| TW | 201140670 A1 | 11/2011 |
| TW | 201230263 A1 | 7/2012 |
| TW | 201513278 A | 4/2015 |

*Primary Examiner* — Thinh T Nguyen
(74) *Attorney, Agent, or Firm* — TraskBritt

(57) ABSTRACT

A semiconductor device that includes a redistribution layer (RDL) is disclosed. A chip is mounted on the RDL within a chip mounting area. The RDL is electrically connected to the chip. A molding compound covers and encapsulates the chip. A first stress-relief feature is embedded in the molding compound within a peripheral area adjacent to the chip mounting area. A second stress-relief feature is embedded in the molding compound within the chip mounting area. The first stress-relief feature is composed of a first material. The second stress-relief feature is composed of a second material that is different from the first material.

11 Claims, 15 Drawing Sheets

(51) Int. Cl.
*H01L 21/56* (2006.01)
*H01L 23/31* (2006.01)

(56) References Cited

U.S. PATENT DOCUMENTS

| | | | |
|---|---|---|---|
| 2004/0101993 A1 | 5/2004 | Salmon | |
| 2009/0294949 A1 | 12/2009 | Meyer | |
| 2009/0309212 A1* | 12/2009 | Shim, II | H01L 21/568 257/700 |
| 2012/0001325 A1* | 1/2012 | Lin | H01L 21/568 257/737 |
| 2014/0091471 A1* | 4/2014 | Chen | H01L 24/19 257/770 |
| 2014/0217597 A1 | 8/2014 | Lin | |
| 2015/0021754 A1* | 1/2015 | Lin | H01L 23/5389 257/712 |
| 2015/0179616 A1* | 6/2015 | Lin | H01L 25/50 257/773 |
| 2015/0187710 A1 | 7/2015 | Scanlan | |
| 2015/0371938 A1* | 12/2015 | Katkar | H01L 25/50 257/774 |

* cited by examiner

WAFER LEVEL PACKAGE AND FABRICATION METHOD THEREOF

CROSS REFERENCE TO RELATED APPLICATIONS

This application is a continuation-in-part of U.S. patent application Ser. No. 14/749,619 filed Jun. 24, 2015, the disclosure of which is incorporated herein in its entirety by this reference.

BACKGROUND OF THE INVENTION

1. Field of the Invention

The present invention relates generally to the field of semiconductor packaging, and more particularly to a wafer level package (WLP) having stress-relief features embedded in an upper portion of the molding compound.

2. Description of the Prior Art

Wafer level packaging process is known in the art. In a wafer level packaging process, a wafer with integrated circuit fabricated therein or chips mounted thereon undergoes a series process, such as grinding, die-bonding, molding and so on, and is finally cut into finished products. Wafer level packaging process has been considered as suitable technology for small sized and high-speed package.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious especially in a large sized wafer, and has raised an obstacle to a wafer level semiconductor packaging process. Therefore, there remains a need in the art for an improved method of manufacturing wafer level packages.

SUMMARY OF THE INVENTION

The present invention is directed to provide an improved semiconductor device that is capable of alleviating or eliminating warpage of a wafer or a package, thereby improving reliability of the semiconductor package.

In one aspect of the invention, a semiconductor device includes a chip having an active surface and a rear surface that is opposite to the active surface; a molding compound covering and encapsulating the chip except for the active surface; a redistribution layer (RDL) on the active surface and on the molding compound, wherein the RDL is electrically connected to the chip; and a stress-relief features embedded in the molding compound.

According to one embodiment of the invention, the semiconductor device further comprises a through substrate via (TSV) interposer that is electrically coupled to the RDL. A plurality of solder bumps may be formed on a bottom surface of the TSV interposer for further connection, for example, to a mother board or printed circuit board.

According to another aspect of the invention, a semiconductor device that includes a redistribution layer (RDL) is disclosed. At least one chip is mounted on the RDL within a chip mounting area. The RDL is electrically connected to the chip. A molding compound covers and encapsulates the chip. A first stress-relief feature is embedded in the molding compound within a peripheral area adjacent to the chip mounting area. A second stress-relief feature is embedded in the molding compound within the chip mounting area. The first stress-relief feature is composed of a first material. The second stress-relief feature is composed of a second material that is different from the first material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
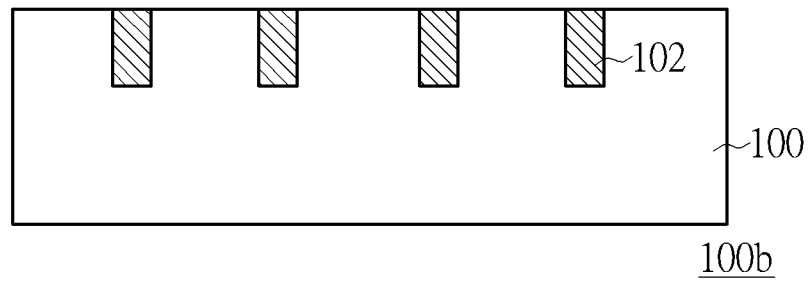
FIGS. 1 through 8 are schematic, cross-sectional diagrams showing an exemplary method for fabricating a wafer level package with through substrate vias (TSVs) according to one embodiment of the invention.

In the following detailed description of the invention, reference is made to the accompanying drawings, which form a part hereof, and in which is shown, by way of illustration, specific embodiments in which the invention may be practiced.

These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale.

The terms "die", "semiconductor chip, " and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL).

The term "substrate" is understood to include semiconductor wafers, but is not limited thereto. The term "substrate" is also used to refer to semiconductor structures during processing, and may include other layers that have been fabricated thereupon.

As used herein, the term "TSV" is defined broadly to include any wafer or IC die having a through via filled with an electrically conductive filler material (e.g., metal such as copper or tungsten). The TSV via provides an electrical contact that extends from the bottom of the wafer or IC die and extends to the contact level or any of the metal interconnect levels on the top side wafer or die surface.

FIGS. 1 through 8 are schematic, cross-sectional diagrams showing an exemplary method for fabricating a wafer level package with through substrate vias (TSVs) according to one embodiment of the invention.

As shown in FIG. 1, first, a wafer 100 is provided. The wafer 100 may comprise a silicon wafer, a semiconductor wafer, or an interposer wafer, but is not limited thereto. For example, the wafer 100 may be a silicon interposer wafer. The wafer 100 has a front side 100a and a back side 100b that is opposite to the front side 100a. A plurality of through substrate vias (TSVs) 102 may be formed in the wafer 100 on the front side 100a of the wafer 100.

The method for making of the TSVs 102 is well known in the art. For example, to form the TSVs 102, TSV holes are formed on the front side 100a of the wafer 100 to a predetermined depth below a major surface of the wafer 100. Metals including, but not limited to, diffusion barrier metals and copper are deposited into the TSV holes. The front side 100a of the wafer 100 is then subjected to a polishing process.

Figure 2:
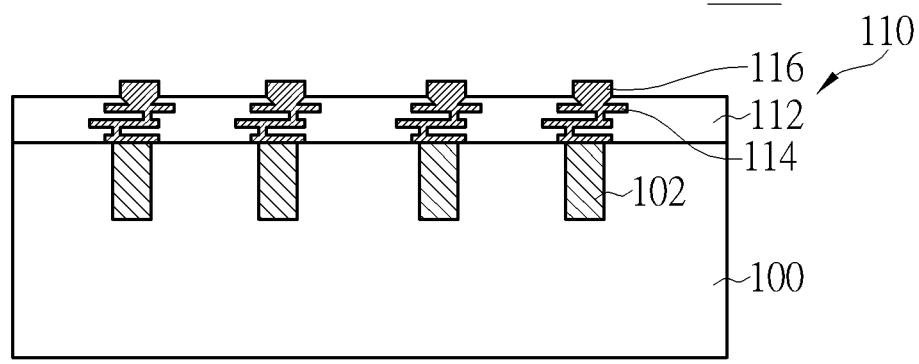

As shown in FIG. 2, subsequently, a redistribution layer (RDL) 110 is formed on the front side 100a of the wafer 100. The RDL 110 may comprise at least one dielectric layer 112 and at least one metal layer 114. The TSVs 102 may be connected with the metal layer 114. The RDL 110 may comprise a build-up interconnect structure.

Subsequently, a plurality of bumps 116 such as micro-bumps may be formed on the RDL 110 for further connections. The bumps 116 may be directly formed on respective contact pads formed in the metal layer 114.

Figure 3:
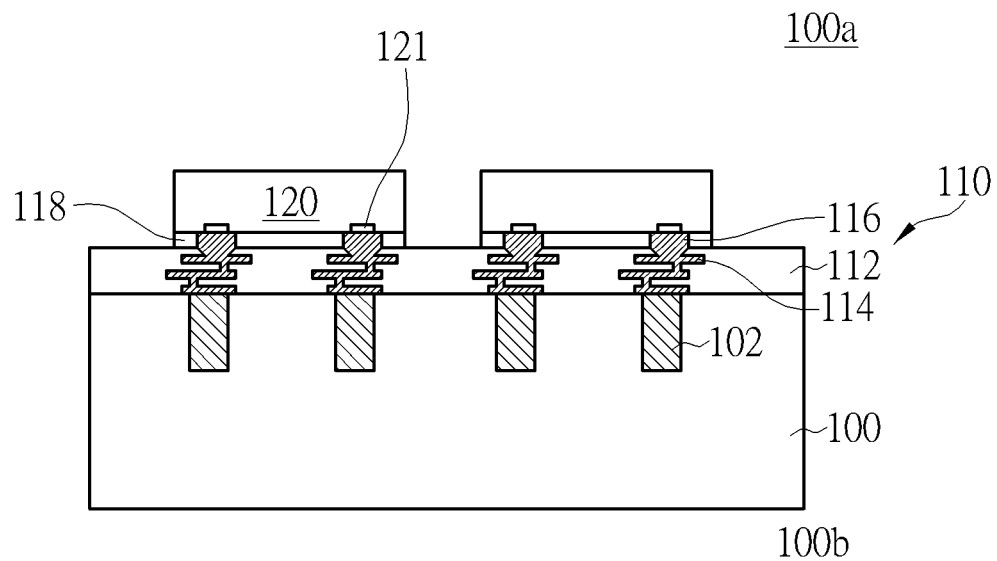

As shown in FIG. 3, after the formation of the bumps 116, individual flipped chips or dies 120 with their active sides facing down toward the RDL 110 are then mounted on the RDL 110 to thereby forming a stacked chip-to-wafer (C2W) construction. A plurality of input/output (I/O) pads 121 may be provided on the active side of each chip 120. The bumps 116 are aligned with the I/O pads 121.

Optionally, an underfill 118 may be applied between each chip or die 120 and the front side 100a of the wafer 100. Thereafter, a thermal process may be performed to reflow the bumps 116.

Figure 4:
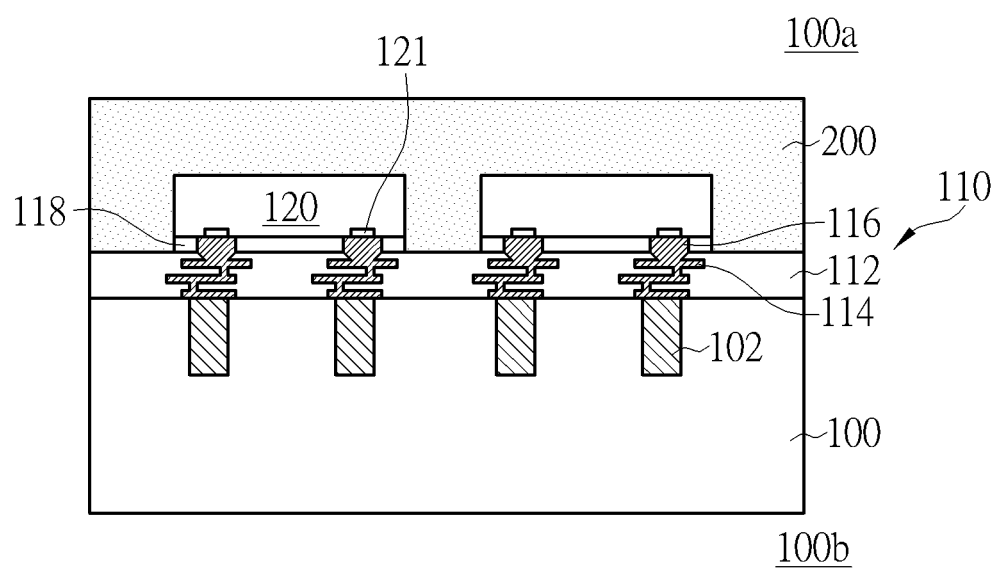

As shown in FIG. 4, after the die-bonding process, the front side 100a of the wafer 100 is covered with a molding compound 200. The molding compound 200 covers the attached dies 120 and the top surface of the RDL 110. The molding compound 200 may be subjected to a curing process.

According to the illustrated embodiment, the molding compound 200 may be formed using thermoset molding compounds in a transfer mold press, for example. Other means of dispensing the molding compound may be used. Epoxies, resins, and compounds that are liquid at elevated temperature or liquid at ambient temperatures may be used. The molding compound 200 is an electrical insulator, and may be a thermal conductor. Different fillers may be added to enhance the thermal conduction, stiffness or adhesion properties of the molding compound 200.

Figure 5:
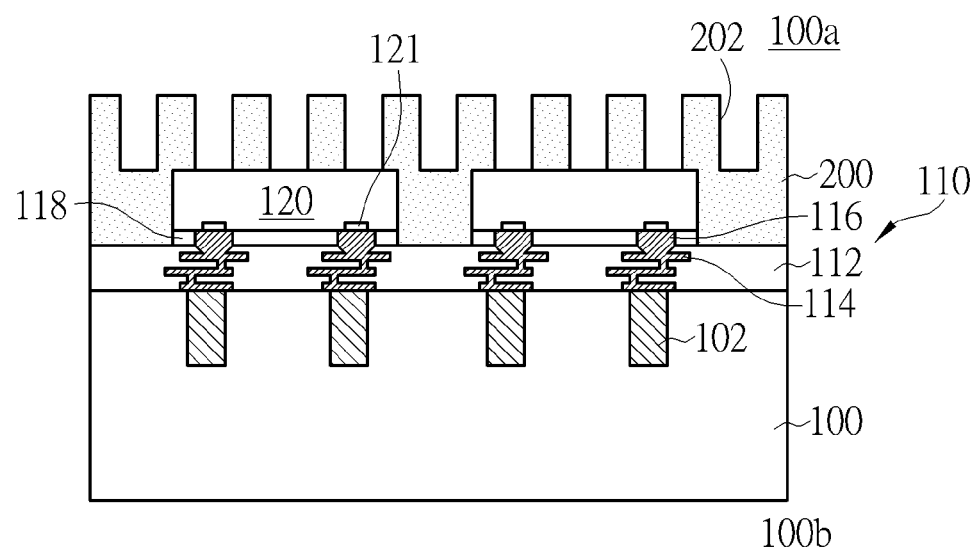

As shown in FIG. 5, after the formation of the molding compound 200, a plurality of trenches 202 is formed in the upper portion of the molding compound 200. The trenches 202 may be formed by using cutting, sawing, laser, or etching, but is not limited thereto. According to the illustrated embodiment, the trenches 202 may be located directly above the chip or die 120.

Figure 9A:
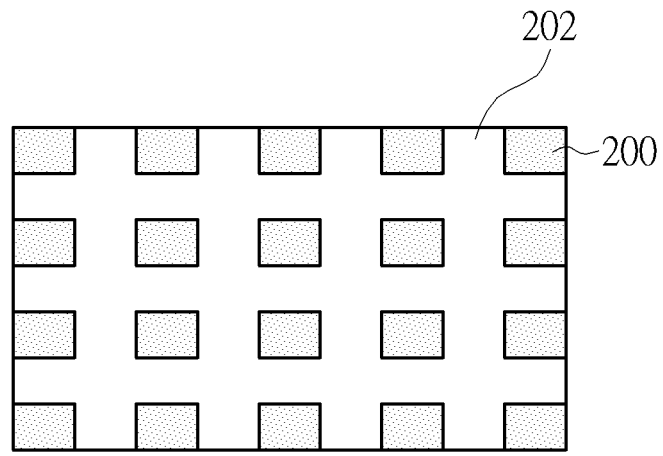
FIGS. 9A-9C are schematic top view diagrams illustrating some exemplary layouts of the trenches on the molding compound.
Figure 9B:
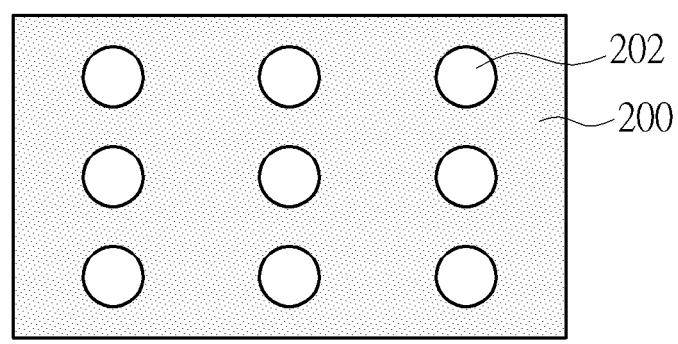
Figure 9C:
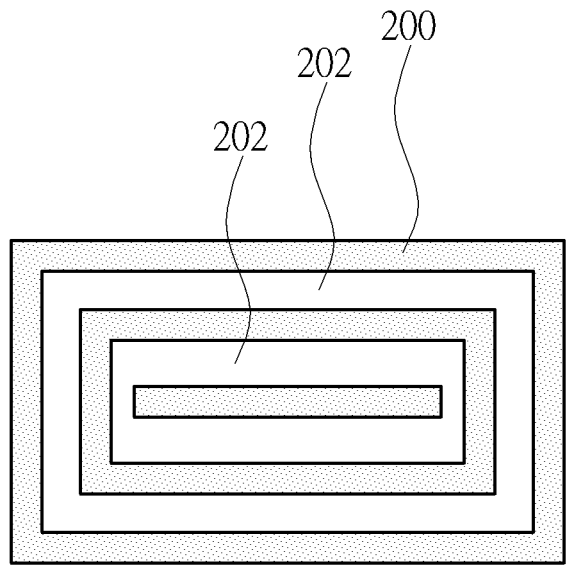

FIGS. 9A-9C are schematic top view diagrams illustrating some exemplary layouts of the trenches 202 on the molding compound 200. As shown in FIG. 9A, the trenches 202 may be arranged in a grid pattern. As shown in FIG. 9B, the trenches 202 may be arranged in an isolated hole pattern. As shown in FIG. 9C, the trenches 202 may be arranged in a concentric annular pattern. It is to be understood that other patterns may be applicable depending upon the design requirements.

Figure 6:
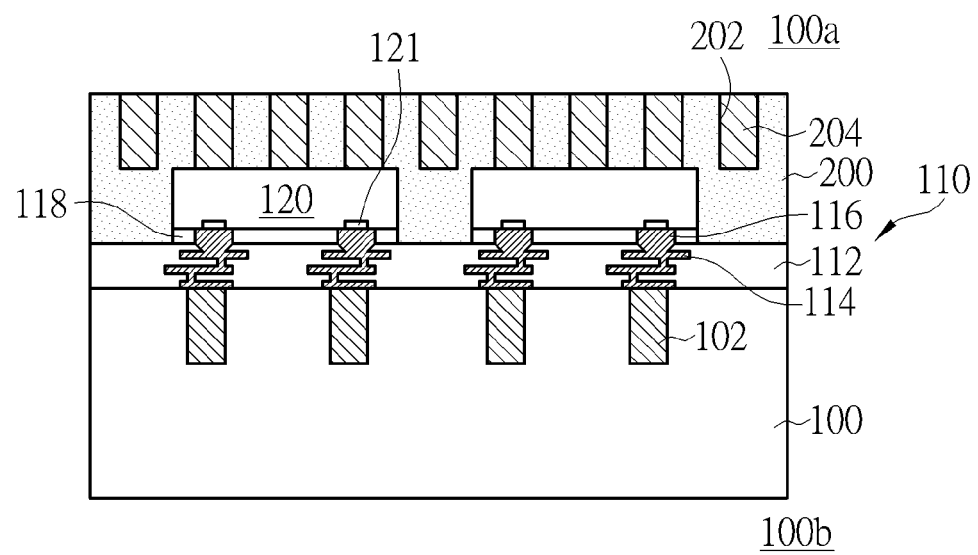

As shown in FIG. 6, subsequently, stress-relief features 204 are formed in the respective trenches 202 on the molding compound 200. According to the illustrated embodiment, the stress-relief features 204 may completely fill up the trenches 202. The stress-relief features 204 may comprise a flexible material having a relatively low Yang's modulus. For example, the aforesaid flexible material may comprise organic materials such as photoresist, polyimide, or benzocyclobutene.

Figure 7:
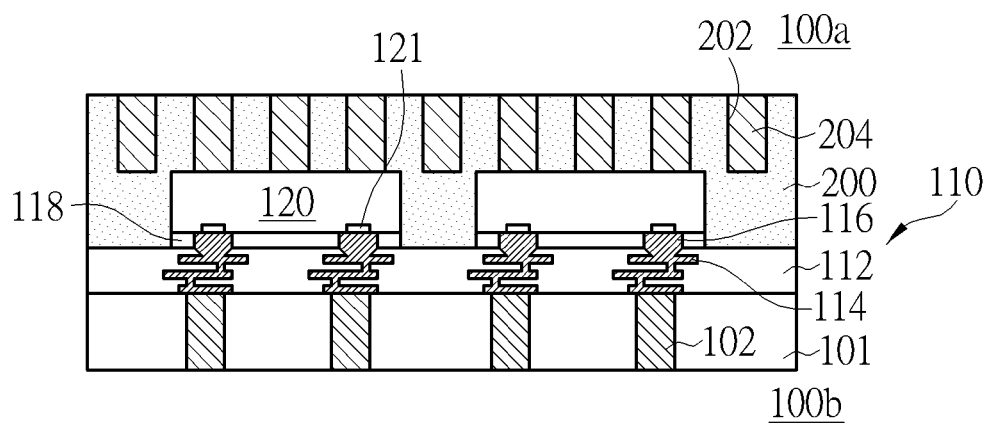

As shown in FIG. 7, after the formation of the molding compound 200 and the stress-relief features 204, the wafer 100 is subjected to a wafer back side grinding process in order to remove a portion of the wafer 100 from the back side 100b, thereby forming a TSV interposer 101. For example, the wafer 100 may be first loaded into a wafer grinder (not shown). Then, a polishing pad is in contact with the rear side 100b of the wafer 100 and starts to grind the rear side. The grinding or milling process reduces the thickness of the wafer 100 to thereby expose the lower ends of the TSVs 102.

Figure 8:
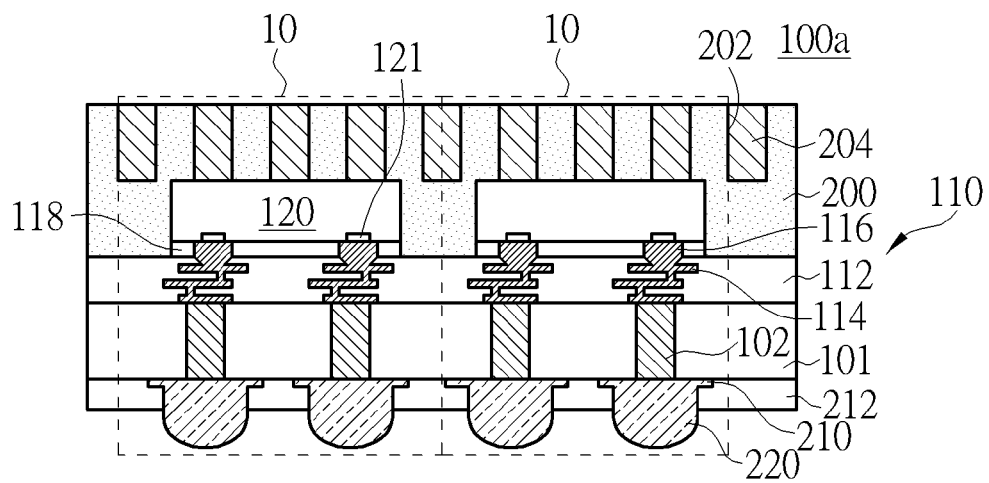

As shown in FIG. 8, metallization may be performed on the back side 100b of the wafer 100 to form a plurality of bump pads 210 in the insulation layer 212. Subsequently, a plurality of solder bumps or solder balls 220 may be formed on the respective bump pads 210. Thereafter, the wafer 100 may be diced to separate individual wafer level packages 10 from one another.

According to the illustrated embodiment, the stress-relief features 204 embedded in the upper portion of the molding compound 200 can alleviate or avoid the warpage of the wafer 100 both in wafer level and in chip level.

FIGS. 10 through 17 are schematic, cross-sectional diagrams showing an exemplary method for fabricating a wafer level package according to another embodiment of the invention.

Figure 10:
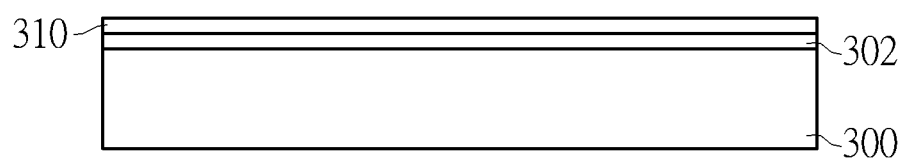
FIGS. 10 through 17 are schematic, cross-sectional diagrams showing an exemplary method for fabricating a wafer level package according to another embodiment of the invention.

As shown in FIG. 10, a carrier 300 is prepared. The carrier 300 may be a releasable substrate material with an adhesive layer 302. At least a dielectric layer 310 may be formed on the carrier 300.

Figure 11:
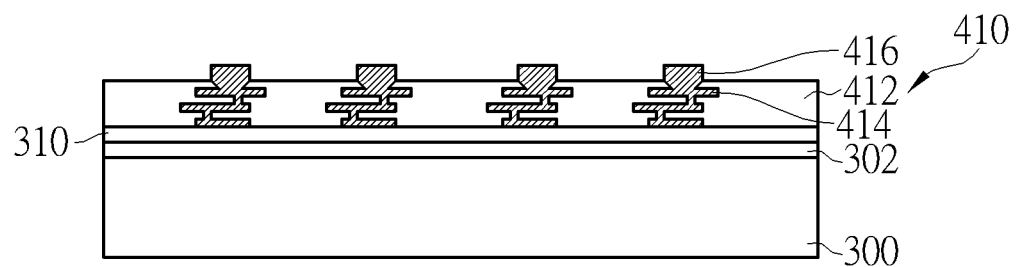

As shown in FIG. 11, subsequently, a redistribution layer (RDL) 410 is formed on the dielectric layer 310. The RDL 410 may comprise at least one dielectric layer 412 and at least one metal layer 414. Subsequently, a plurality of bumps 416 such as micro-bumps may be formed on the RDL 410 for further connections. The bumps 416 may be directly formed on respective contact pads formed in the metal layer 414.

Figure 12:
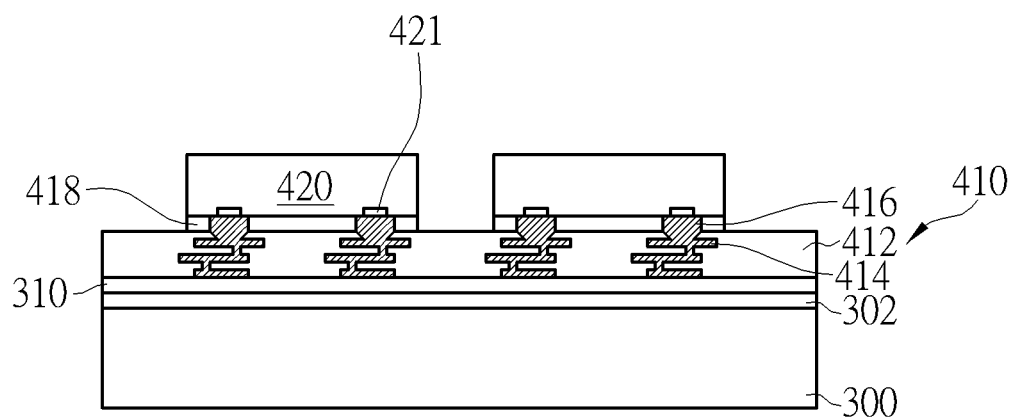

As shown in FIG. 12, after the formation of the bumps 416, individual flip-chips or dies 420 with their active sides facing down toward the RDL 410 are then mounted on the RDL 410 to thereby forming a stacked chip-to-wafer (C2W) construction. A plurality of input/output (I/O) pads 421 may be provided on the active side of each chip 420. The bumps 416 are aligned with the I/O pads 421. Optionally, an underfill 418 may be applied under each chip or die 420. Thereafter, a thermal process may be performed to reflow the bumps 416.

Figure 13:
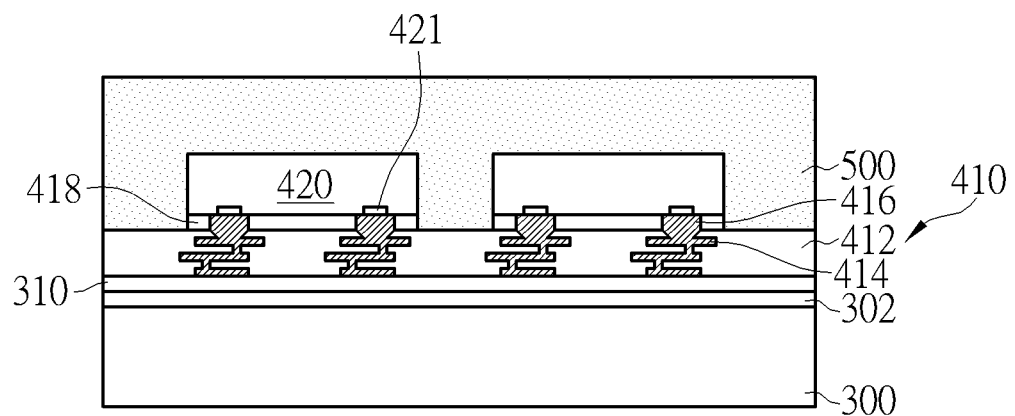

As shown in FIG. 13, after the die-bonding process, a molding compound 500 is applied. The molding compound 500 covers the attached dies 420 and the top surface of the RDL 410. The molding compound 500 may be subjected to a curing process.

Figure 14:
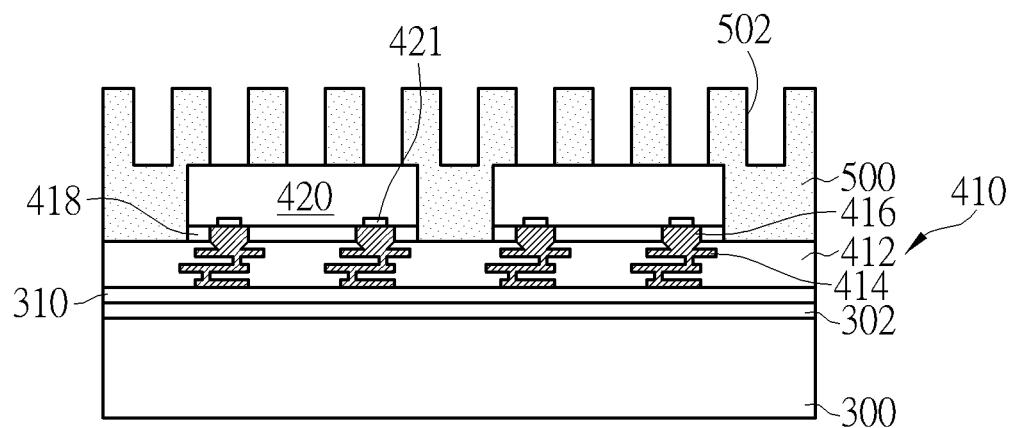

As shown in FIG. 14, after the formation of the molding compound 500, a plurality of trenches 502 are formed in the upper portion of the molding compound 500. The trenches 502 may be formed by using cutting, sawing, laser, or etching, but is not limited thereto. According to the illustrated embodiment, the trenches 502 may be located directly above the chip or die 420.

Figure 15:
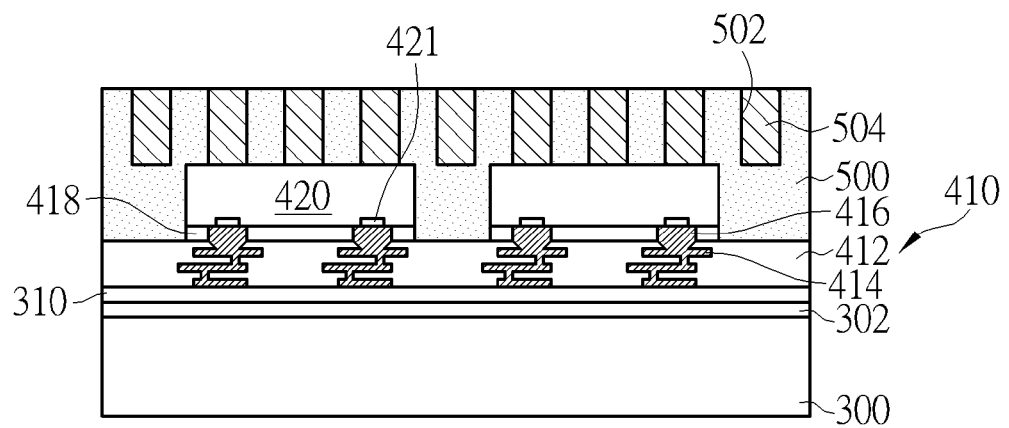

As shown in FIG. 15, subsequently, stress-relief features 504 are formed in the respective trenches 502 on the molding compound 500. According to the illustrated embodiment, the stress-relief features 504 may completely fill up the trenches 502. The stress-relief features 504 may comprise a flexible material having a relatively lower Yang's modulus. For example, the aforesaid flexible material may comprise organic materials such as photoresist, polyimide, or benzocyclobutene.

Figure 16:
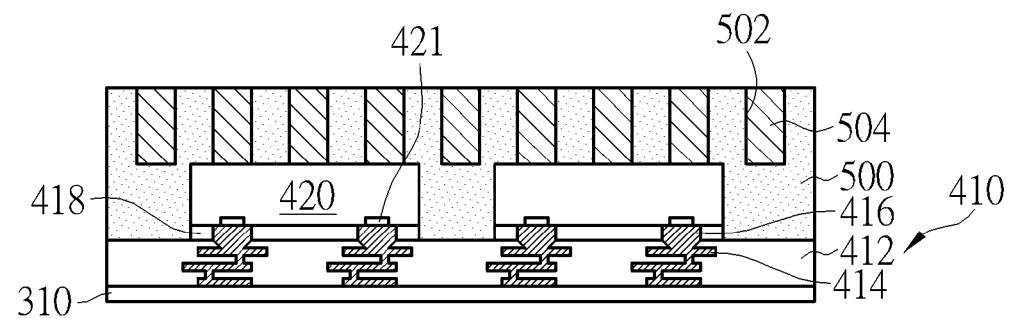

As shown in FIG. 16, after the formation of the molding compound 500 and the stress-relief features 504, the carrier 300 and the adhesive layer 302 are removed or peeled off to expose the dielectric layer 310.

Figure 17:
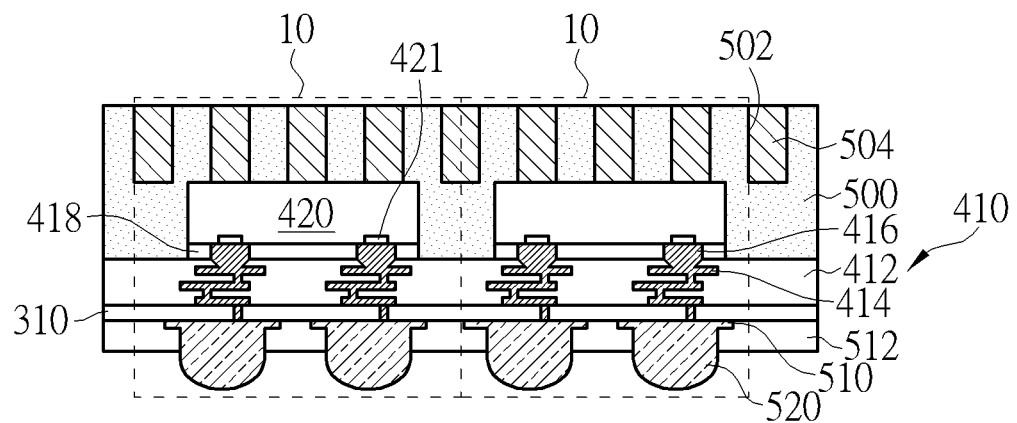

As shown in FIG. 17, metallization may be performed on the dielectric layer 310 to form a plurality of bump pads 510 in the insulation layer 512. Subsequently, a plurality of solder bumps or solder balls 520 may be formed on the respective bump pads 510. Thereafter, a dicing process is performed to separate individual wafer level packages 10 from one another.

Figure 18:
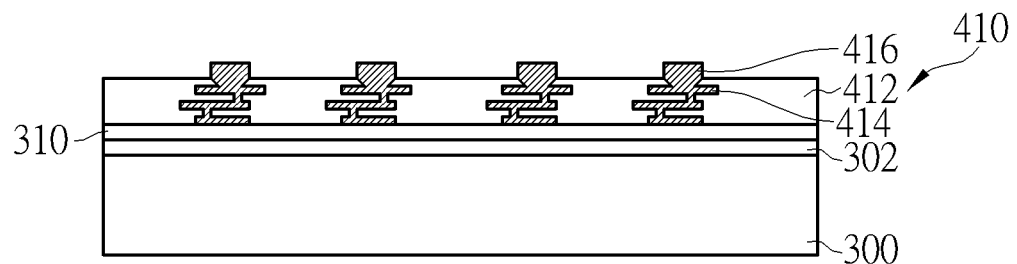
FIGS. 18 through 26 are schematic, cross-sectional diagrams showing an exemplary method for fabricating a wafer level package according to yet another embodiment of the invention.

FIGS. 18 through FIG. 26 are schematic, cross-sectional diagrams showing an exemplary method for fabricating a wafer level package according to yet another embodiment of the invention, wherein like numeral numbers designate like elements, regions or layers. As shown in FIG. 18, likewise, a redistribution layer (RDL) 410 is formed on the dielectric layer 310. The RDL 410 may comprise at least one dielectric layer 412 and at least one metal layer 414. Subsequently, a plurality of bumps 416 such as micro-bumps may be formed on the RDL 410 for further connections. The bumps 416 may be directly formed on respective contact pads formed in the metal layer 414.

Figure 19:
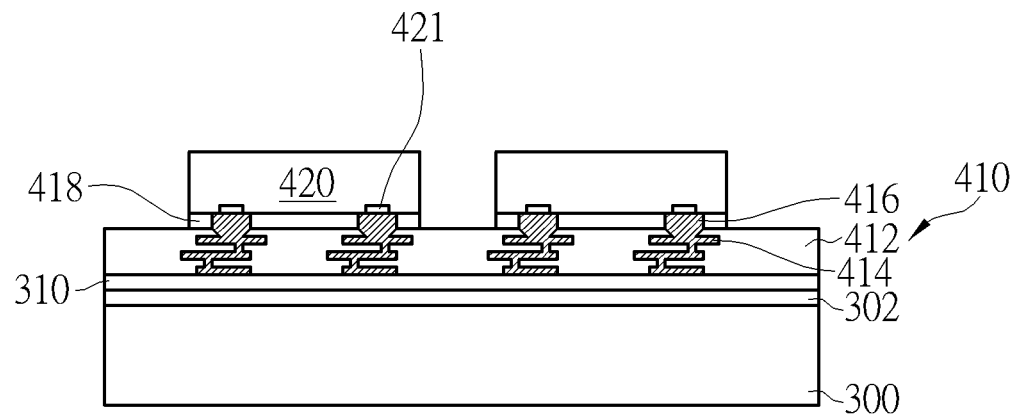

As shown in FIG. 19, after the formation of the bumps 416, individual flip-chips or dies 420 with their active sides facing down toward the RDL 410 are then mounted on the RDL 410 to thereby forming a stacked chip-to-wafer (C2W) construction. A plurality of input/output (I/O) pads 421 may be provided on the active side of each chip 420. The bumps 416 are aligned with the I/O pads 421. Optionally, an underfill 418 may be applied under each chip or die 420. Thereafter, a thermal process may be performed to reflow the bumps 416.

Figure 20:
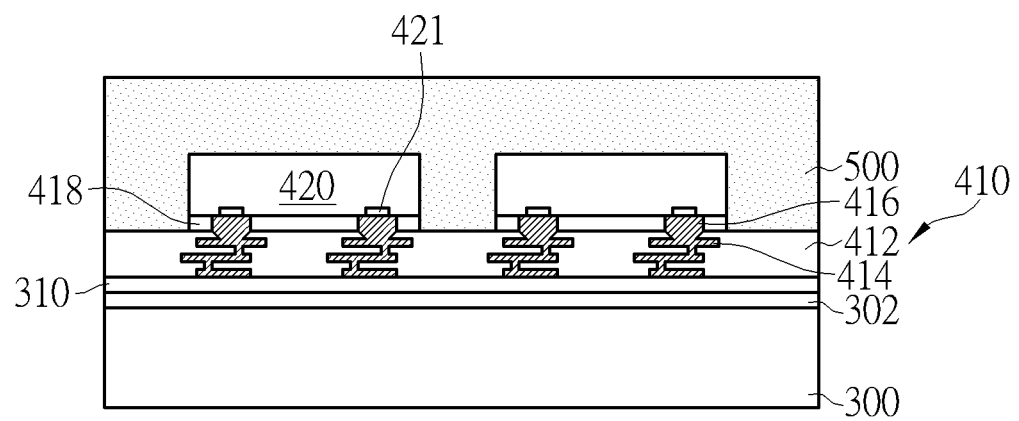

As shown in FIG. 20, after the die-bonding process, a molding compound 500 such as epoxy molding compound (EMC) is applied. The molding compound 500 covers the attached dies 420 and the top surface of the RDL 410. The molding compound 500 may be subjected to a curing process to form an encapsulant.

Figure 21:
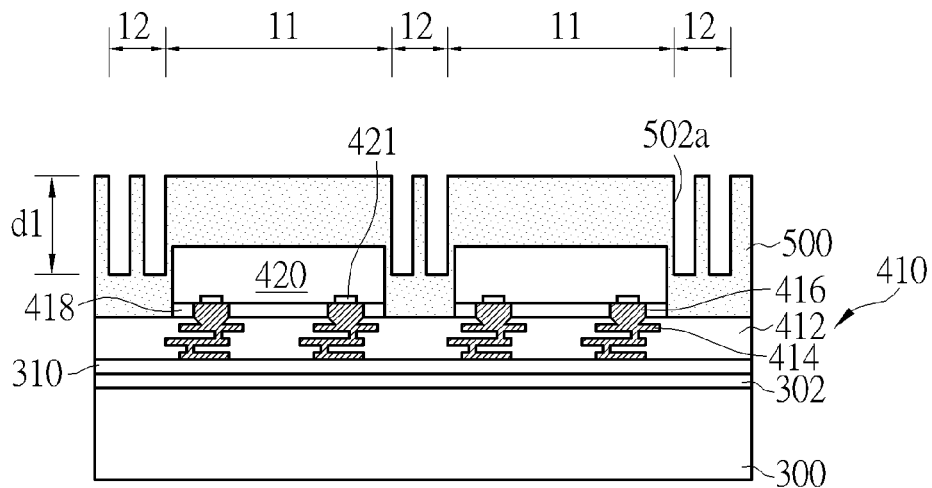

As shown in FIG. 21, after the formation of the molding compound 500, a plurality of first trenches 502a are formed in the upper portion of the molding compound 500. The first trenches 502a are formed only within a peripheral area 12 around a chip mounting area 11. The first trenches 502a may be formed by using cutting, sawing, laser, or etching, but is not limited thereto. The first trenches 502a may have a trench depth $d_1$. According to the illustrated embodiment, the trench depth $d_1$ is smaller than the thickness of the molding compound 500.

Figure 22:
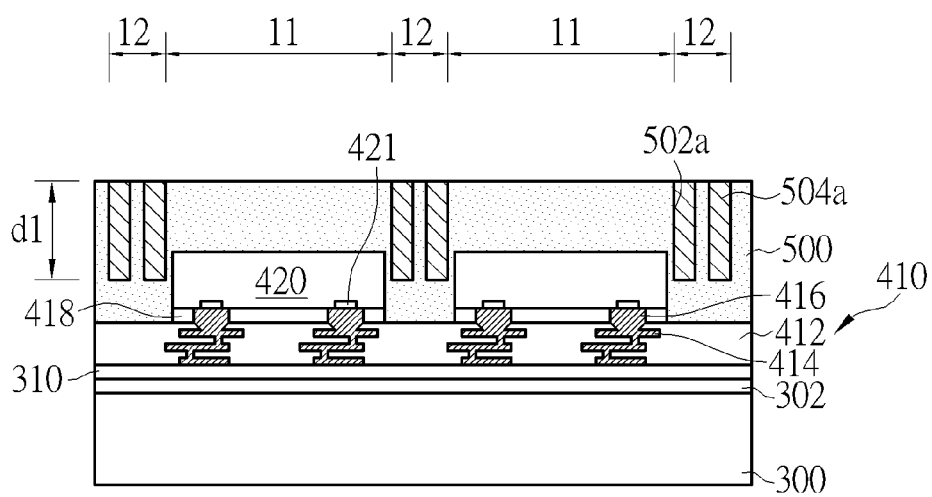

As shown in FIG. 22, subsequently, first stress-relief features 504a are formed in the respective first trenches 502a in the molding compound 500. According to the illustrated embodiment, the first stress-relief features 504a may completely fill up the first trenches 502a. The first stress-relief features 504a may comprise a first material having a relatively lower Yang's modulus. For example, the aforesaid first material may comprise organic materials such as photoresist, polyimide, polybenzoxazole (PBO) or benzocyclobutene (BCB).

Figure 23:
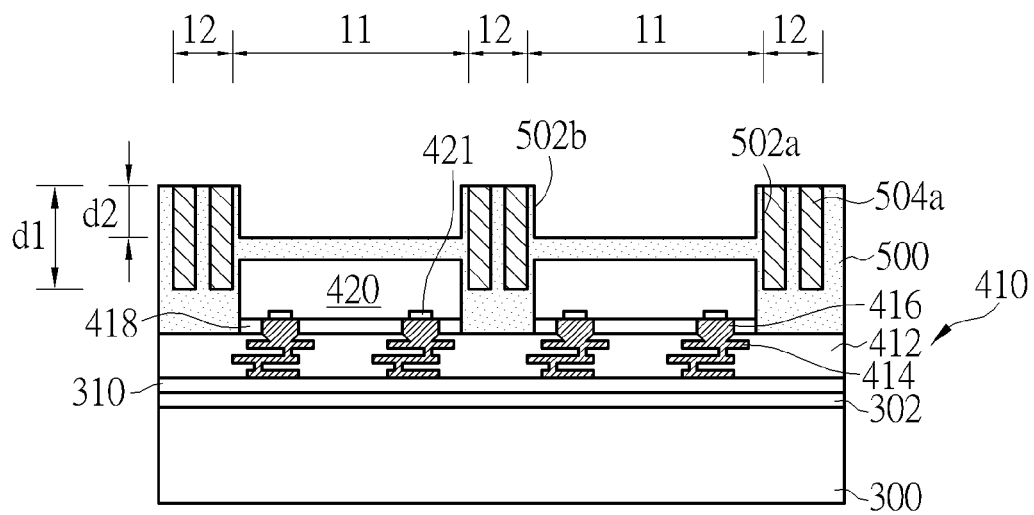

As shown in FIG. 23, after the formation of the first stress-relief features 504a, a recessed region 502b is formed in the upper portion of the molding compound 500 within each chip mounting area 11. The recessed region 502b may be formed by using laser or etching, but is not limited thereto. According to the illustrated embodiment, the recessed region 502b is located directly above the chip 420. According to the illustrated embodiment, the recessed region 502b has a depth $d_2$ that is smaller than the thickness of the molding compound 500 directly above the chip 420. The top surface of the chip 420 is not exposed at this stage.

Figure 24:
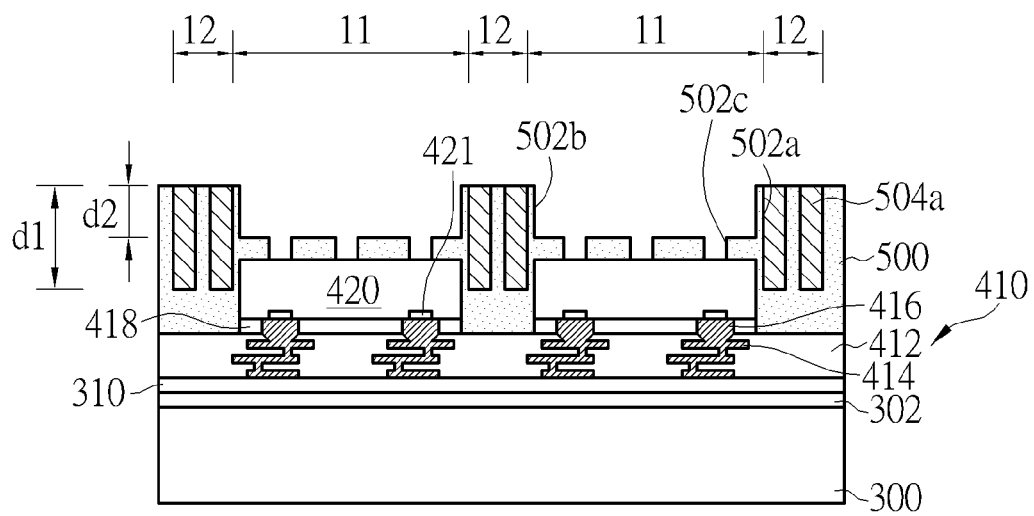

As shown in FIG. 24, after the formation of the recessed region 502b, second trenches 502c are formed in the upper portion of the molding compound 500 within the recessed region 502b. The second trenches 502c may be formed by using laser or etching, but is not limited thereto. The second trench 502c exposes a portion of the top surface of the chip 420.

Figure 25:
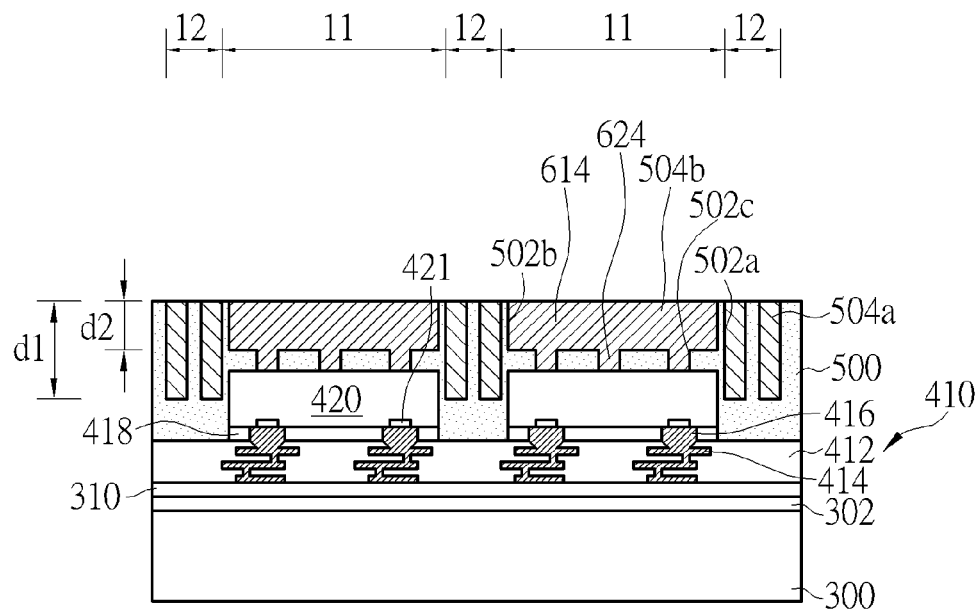

As shown in FIG. 25, subsequently, second stress-relief features 504b are formed in the respective second trenches 502c and in the recessed regions 502b in the molding compound 500. According to the illustrated embodiment, the second stress-relief features 504b may completely fill up the second trenches 502c and the recessed regions 502b. The second stress-relief features 504b may comprise a second material having a relatively high heat conduction property. For example, the aforesaid second material may comprise metals such as copper, silver, aluminum, etc. The heat generated by the chip 420 during operation can be efficiently dissipated by the second stress-relief features 504b. According to the illustrated embodiment, each of the second stress-relief features 504b may comprise a plate portion 614 and a via portion 624 that is integrally formed with the plate portion 614. The plate portion 614 has a top surface that is flush with the top surface of the molding compound 500.

Figure 26:
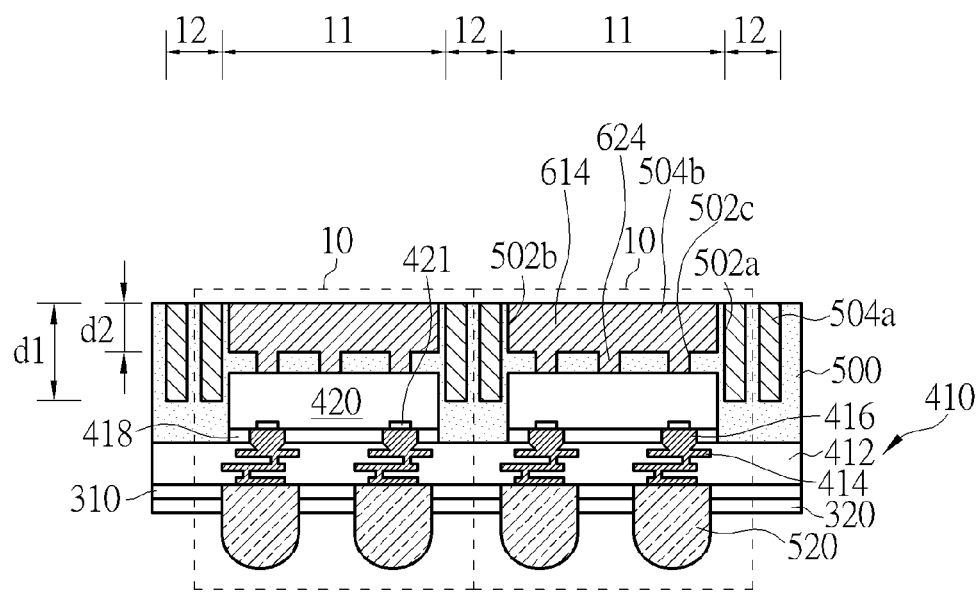

As shown in FIG. 26, after the formation of the second stress-relief features 504b, the carrier 300 and the adhesive layer 302 are removed or peeled off to expose the dielectric layer 310. The de-bonding of the carrier 300 may be performed by using a laser process, UV irradiation process, grinding process, or etching process, but is not limited thereto. After de-bonding the carrier 300, a solder mask 320 may be formed on the dielectric layer 310. Openings may be formed in the dielectric layer 310 and the older mask 320 to expose respective solder pads, and then solder bumps or solder balls 520 may be formed on the respective solder pads. Thereafter, a dicing process is performed to separate individual wafer level packages 10 from one another.

The second stress-relief features 504b is in direct contact with the chip 420. More specifically, the second stress-relief features 504b is indirect contact with a rear side or passive surface of the chip 420 and may be employed to balance the stress in the chip package and also dissipate heat generated by the chip during operation.

According to the illustrated embodiment, the second stress-relief features 504b is composed of second material such as metals, which is different from the first stress-relief features 504a composed of a first material such as photoresist, polyimide, polybenzoxazole (PBO) or benzocyclobutene.

Figure 27:
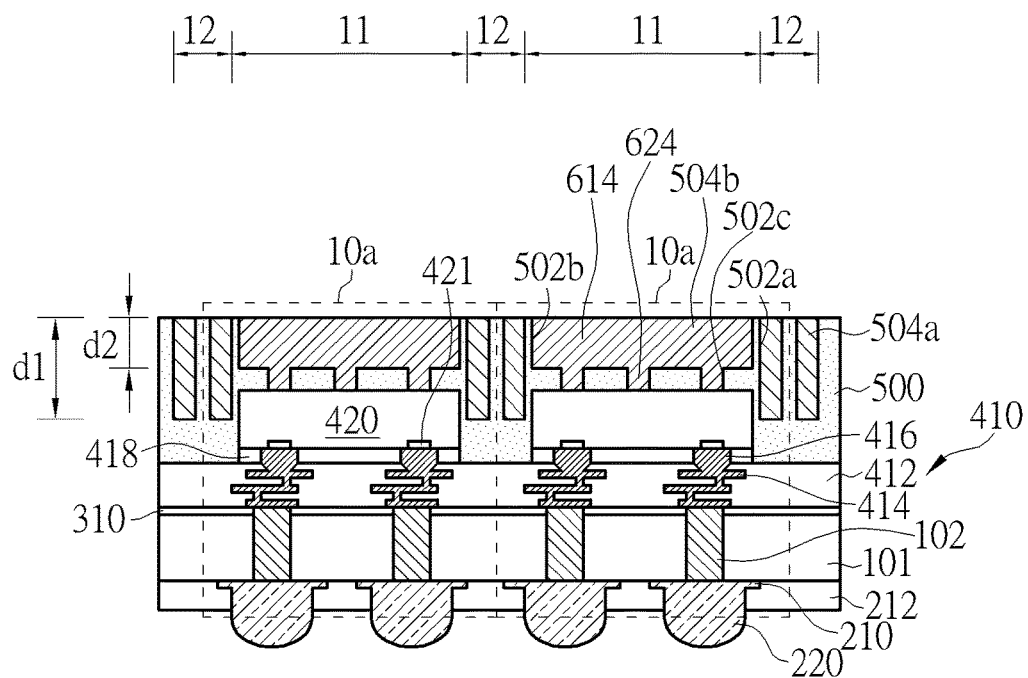
FIG. 27 is a schematic, cross-sectional diagram showing a wafer level package with a TSV substrate according to still another embodiment of the invention.

FIG. 27 shows a wafer level package with a TSV substrate according to still another embodiment of the invention. As shown in FIG. 27, the wafer level package 10a is different from the wafer level package 10 in FIG. 26 in that the wafer level package 10a further comprises a TSV interposer 101 coupled to the RDL 410. The structure of the TSV interposer 101 and an exemplary method for fabricating such TSV interposer 101 are described in FIGS. 1 through 8. Likewise, a plurality of solder bumps or balls 520 is formed on a bottom surface of the TSV interposer 101.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a redistribution layer (RDL);
at least one chip having an active surface and a rear surface that is opposite to the active surface, the at least one chip being mounted on the RDL within a chip mounting area with the at least one chip's active surface facing the RDL, wherein the RDL is electrically connected to the chip;
a molding compound covering and encapsulating the at least one chip;
a first stress-relief feature embedded in the molding compound within a peripheral area adjacent to the chip mounting area, the first stress-relief feature comprising a first material having a Yang's modulus less than a Yang's modulus of the molding compound; and
a second stress-relief feature embedded in the molding compound within the chip mounting area, the second stress-relief feature comprising a second material different from the first material, the second material having a thermal conductivity greater than a thermal conductivity of the molding compound.

2. The semiconductor device according to claim 1, wherein the second stress-relief feature is located directly above the rear surface of the at least one chip.

3. The semiconductor device according to claim 2, wherein the second stress-relief feature is in direct contact with the rear surface of the at least one chip.

4. The semiconductor device according to claim 1, wherein the first material comprises photoresist, polyimide, polybenzoxazole (PBO) or benzocyclobutene (BCB).

5. The semiconductor device according to claim 1, wherein the second material comprises a metal material.

6. The semiconductor device according to claim 5, wherein the second material comprises copper, silver, or aluminum.

7. The semiconductor device according to claim 1, wherein the second stress-relief feature comprises a plate portion and a via portion that is integrally formed with the plate portion.

8. The semiconductor device according to claim 1, wherein the RDL is electrically connected to the at least one chip through a plurality of bumps.

9. The semiconductor device according to claim 1, wherein the RDL comprises at least one dielectric layer and at least one metal layer.

10. The semiconductor device according to claim 1, further comprising a through substrate via (TSV) interposer coupled to the RDL.

11. The semiconductor device according to claim 10, further comprising a plurality of solder bumps on a bottom surface of the TSV interposer.

* * * * *